United States Patent [19]
Bond

[11] Patent Number: 4,489,403
[45] Date of Patent: Dec. 18, 1984

[54] FAULT ALIGNMENT CONTROL SYSTEM AND CIRCUITS

[75] Inventor: George L. Bond, Fishkill, N.Y.

[73] Assignee: International Business Machines Corporation, Armonk, N.Y.

[21] Appl. No.: 381,266

[22] Filed: May 24, 1982

[51] Int. Cl.³ ............................................. G11C 11/40
[52] U.S. Cl. .................................... 365/200; 365/230; 371/11
[58] Field of Search ............... 365/200, 201, 210, 230; 371/10, 11, 38

[56] References Cited

U.S. PATENT DOCUMENTS

| | | | |
|---|---|---|---|
| 3,644,902 | 2/1972 | Beawsoleil | 365/200 |
| 3,781,826 | 12/1973 | Beawsoleil | 371/10 |
| 3,812,336 | 5/1974 | Bossen et al. | 371/38 |
| 3,897,626 | 8/1975 | Beawsoleil | 365/200 |

OTHER PUBLICATIONS

IBM Technical Disclosure Bulletin, vol. 16, No. 4, Sep. 1973, p. 1245, Address Reconfiguration for Large-Scale Integrated Memory Yield Enhancement, D. C. Bossen et al.

Primary Examiner—Joseph A. Popek
Attorney, Agent, or Firm—James E. Murray

[57] ABSTRACT

The makeup of memory words is controlled by a memory address permutator that permits up to $2^n!$ input bit combinations. The particular combinations used in any decoder is dependent on the particular application. The new permutator also permits scattering of certain faults throughout the usable memory address space while simultaneously accumulating other faults in deallocated sections of the memory.

6 Claims, 9 Drawing Figures

FAULT ALIGNMENT CONTROL SYSTEM AND CIRCUITS

BACKGROUND OF THE INVENTION

The present invention relates to permutation logic for changing words with uncorrectable errors (UE's) into memory words that can be corrected by the error correcting code protecting the data in the memory.

In copending Bossen et al. patent application Ser. No. 362,925 filed Mar. 29, 1982 and entitled "Deterministic Permutation Algorithm", a memory address register accesses a memory word by supplying the same logical address to decoders for all bit positions of the word. However, as a result of modification of logic circuitry the address actually applied to the decoder of any particular bit position can differ from the logical address supplied by the address register. The logic circuitry is called permutation logic. Because of the permutation logic, a memory word can contain storage cells located at a number of different physical addresses that are not the logical address supplied by the memory register.

The prior art permutation logic performs a single Exclusive OR function on each of the n inputs to the decoder of the particular bit position. Each of the n digits of the word address is Exclusive ORed with a different bit to permute the address.

If the bit decoder is a two bit decoder, the prior art permutation logic can provide to the decoder $2^n$ or four different combinations or sequences of bit inputs. These are shown in Table 1.

TABLE I

| Input Bits | Permutation Bits Z1 Z0 | | | |
|---|---|---|---|---|
| C1,C0 | 00 | 01 | 10 | 11 |
| 00 | 00 | 01 | 10 | 11 |
| 01 | 01 | 00 | 11 | 10 |
| 10 | 10 | 11 | 00 | 01 |
| 11 | 11 | 10 | 01 | 00 |

These four sequences form only a small subset of the possible decoder input sequences. There are actually $2^n!$ or 24 possible input sequences for a two bit decoder. The decimal equivalents of all possible sequences are shown in Table 2.

TABLE 2

| Decoder Inputs Bits | Possible Input Sequences C1' C0' | | | | | | | | | | | | | | | | | | | | | | | |
|---|---|---|---|---|---|---|---|---|---|---|---|---|---|---|---|---|---|---|---|---|---|---|---|---|
| C1 C0 | | | | * | | * | | | | | | | | | | | | | * | | * | | | |
| 0 0 | 0 | 0 | 0 | 0 | 0 | 0 | 1 | 1 | 1 | 1 | 1 | 1 | 2 | 2 | 2 | 2 | 2 | 2 | 3 | 3 | 3 | 3 | 3 | 3 |
| 0 1 | 1 | 1 | 3 | 2 | 2 | 3 | 1 | 0 | 3 | 2 | 2 | 3 | 0 | 1 | 3 | 0 | 0 | 3 | 1 | 1 | 0 | 2 | 2 | 0 | 1 |
| 1 0 | 2 | 1 | 3 | 1 | 2 | 3 | 2 | 0 | 3 | 0 | 2 | 3 | 0 | 1 | 3 | 1 | 0 | 3 | 2 | 1 | 0 | 1 | 2 | 0 |
| 1 1 | 3 | 2 | 1 | 3 | 1 | 2 | 3 | 2 | 0 | 3 | 0 | 2 | 3 | 0 | 1 | 3 | 1 | 0 | 0 | 2 | 1 | 0 | 1 | 2 |

It turns out that certain UE conditions cannot be satisfactorily resolved using any of the $2^n$ input sequences in Table 1 where these same UE conditions could readily be allieviated in one of the other theoretically possible n! input sequences shown in Table 2 were achievable.

In addition to scattering faulty cells to change UE errors into correctable errors the mentioned prior art permutation logic has the ability of accumulating faulty memory elements in one of the memory words. This is done by using the bit address of the faulty elements as the permutation bits in the permutation logic. This is explained in an article entitled "Address Reconfiguration for Large Scale Integrated Memory Yield Enhancement" on page 1245 of the September 1973 issue of the IBM Technical Disclosure Bulletin. The problem with prior art bit permutation logic is that the capability of the prior art permutation logic is such that it cannot be used effectively to simultaneously both disperse and accumulate faulty bits.

THE INVENTION

Therefore, in accordance with the present invention, new address permutation logic is provided. This logic is capable of more than the 2n input combinations listed in Table 1. To accomplish this, a number of permutation techniques are used both singly and in combination including modifying one address bit by another, using more than n permutation bits, and swapping address bit positions.

Therefore, it is an object of the present invention to provide a new permutation apparatus for swapping bits in memory words to change uncorrectable errors into correctable error conditions.

It is another object of the present invention to swap bits to provide more combinations of permutations of address bits to the input decoder.

It is another object of the present invention to provide permutation apparatus capable of both disperse and accumulate faulty bits simultaneously.

THE DRAWINGS

These and other objects of the present invention can be best understood by referring to the figures of the drawings of which.

DETAILED DESCRIPTION

Figure 1:
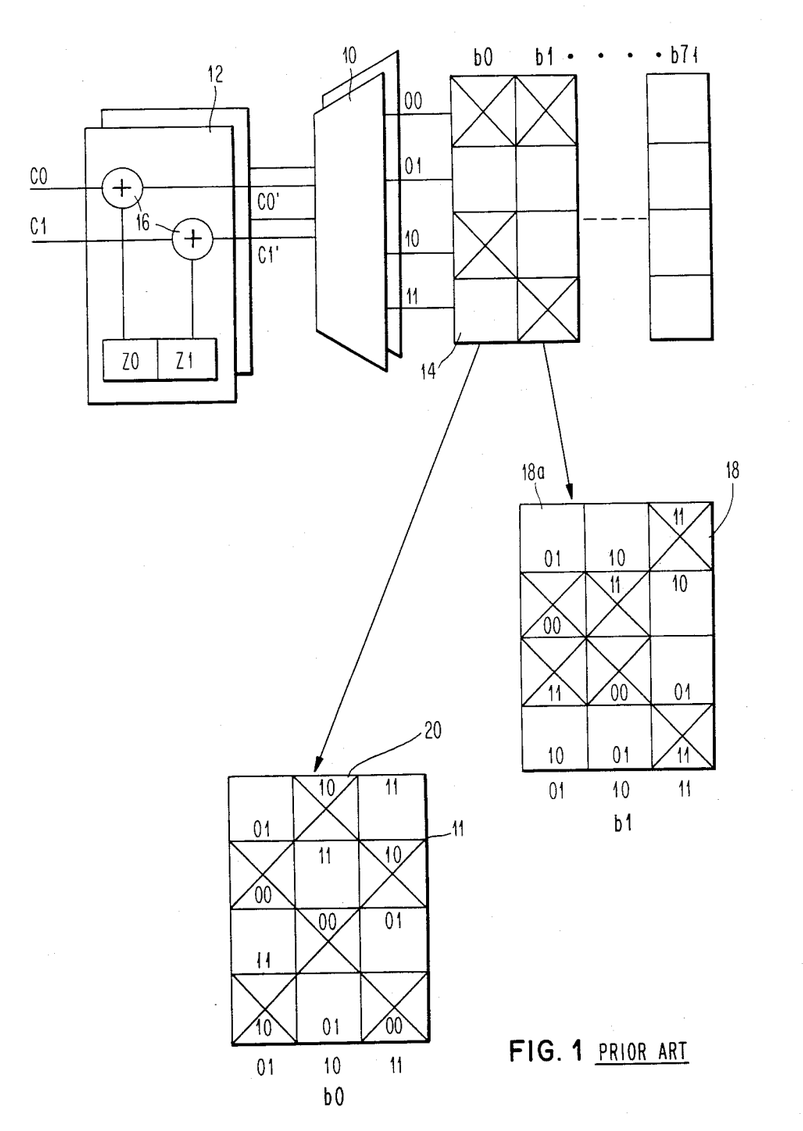
FIG. 1 is a schematic diagram of memory employing prior art permutation logic.

FIG. 1 shows a four word memory where each of the 72 bit positions in a word is accessed by a different 2 bit decoder 10. Identical address bits C0 and C1 are supplied by the address register to each bit position b0 to b71. However, the actual address bits C0' and C1' used to access the decoder of any bit position also depend on permutation bits Z0 and Z1 supplied to permutation logic 12. Exclusive OR circuit 16 in the permutation logic receives one of the address bits C0 or C1 and one of the permutation bits Z0 or Z1 as inputs and supplies C0' or C1' as an output. If both the permutation bits Z0 and Z1 are zero, the physical and logical address of the accessed storage cell are the same. If either one or both the permutation bits Z0 or Z1 is not zero, the physical and logical address of the accessed bit differ.

For purposes of explanation, assume that Z0 and Z1 are zero for all bit positions of the memory in FIG. 1. Then it can be seen that word line 00 of this memory contains bad bits in both bit locations B0 and B1, while word line 10 contains a bad bit in bit location B0 and in location 11 contains a bad bit location in bit location B1. If bit positions B0 and B1 are the only bit positions in the memory containing bad bits, swapping of the bits in the 00 word with the 01 word in either bit position B0 or B1 would permit all four words in the memory to be corrected by a single error correcting double error detecting (SEC/DED) code.

Block 18 shows all possible permutations of bits for bit position B1 using the prior art permutator 12. It will be noticed that it is possible to swap bits of the word location 00 and 01 to eliminate the double error condition in word line 00. This is done by making Z0 equal to 0 and Z1 equal to 1 as shown in column 18A. However, it will be noted that this combination of Z0 and Z1 also swaps bits 10 and 11 introducing a double error condition in word line 10. In fact none of the possible combinations of Z0 and Z1 will eliminate the error in word line 00 without introducing a multiple error condition into another word. The same is true of the possible permutations of C0 and C1 by the permutation bits in bit location B0 and in fact even if both bit locations are simultaneously permuted, it is not possible to obtain a combination of the two sets of permutation bits Z0 and Z1 that will eliminate the multiple error condition. Therefore, we know there are permutations of the bits that will eliminate double conditions but these are not achieveable with the prior art permutator 12.

Figure 2:
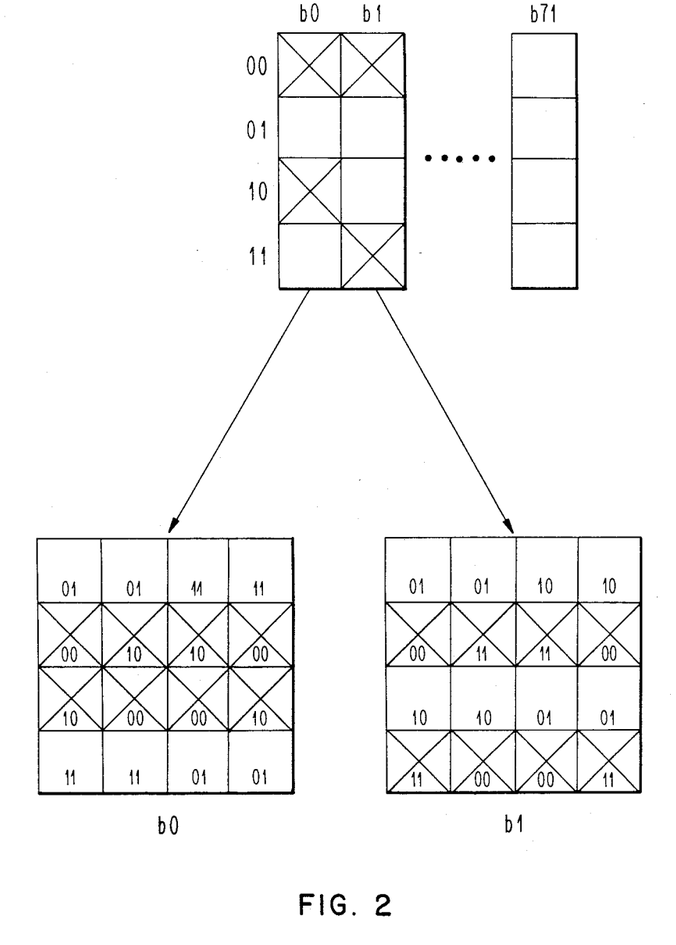
FIG. 2 is a schematic diagram illustrating possible permutation of the faults in the memory of FIG. 1. using permutation logic of the present invention.
Figure 3:
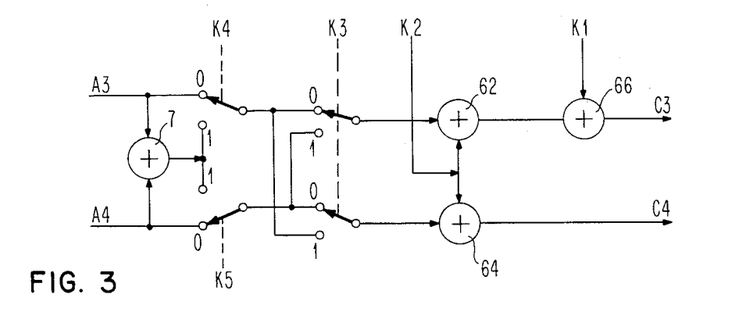
FIG. 3 is a circuit diagram of permutation logic in accordance with the present invention.

In FIG. 2 are shown different permutations of the bits in the memory of FIG. 1 which will eliminate double error conditions by permutation of the address bits of one of the other of its bit locations B0 or B1. A star above a column in Table 2 identifies an input bit sequence of bit B0 used in FIG. 2, while a star below a column identifies an input bit sequence of bit B1 used in FIG. 2. In accordance with the present invention, bit permutation apparatus is provided which will permute the address bits to those sequences which have been identified by stars. As shown in FIG. 3, permutation bit K5 selects between address bit A4 and the function $F = A_3 \oplus A_4$ while permutation bit K4 selects between address bit A3 and the function $F = A_3 \oplus A_4$. Permutation bit K3 swaps the bits A3 and A4. Permutation bit K2 is an input to both Exclusive OR circuits 62 and 64 and permutation vector K1 is an input to Exclusive OR circuit 66. The Table 3 illustrates the effects of permutation vectors on the inputs A3 and A4 to a decoder such as decoder 10 in FIG. 1. As can be seen, the decoder of FIG. 3 produces all the bit sequences of Table 2.

TABLE 3

| | | | | | | | | | | * | | * | | | | | | | | | * | | * | |
|---|---|---|---|---|---|---|---|---|---|---|---|---|---|---|---|---|---|---|---|---|---|---|---|---|
| K0 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 |
| K1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 |
| K2 | 0 | 0 | 0 | 0 | 1 | 1 | 1 | 1 | 0 | 0 | 0 | 0 | 1 | 1 | 1 | 1 | 0 | 0 | 0 | 0 | 1 | 1 | 1 | 1 |
| K3 | 0 | 0 | 0 | 0 | 0 | 0 | 0 | 0 | 1 | 1 | 1 | 1 | 1 | 1 | 1 | 1 | 0 | 0 | 0 | 0 | 0 | 0 | 0 | 0 |
| K4 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 |

| C1 | C2 | | | | | | | | | | | | | | | | | | | | | | | |
|---|---|---|---|---|---|---|---|---|---|---|---|---|---|---|---|---|---|---|---|---|---|---|---|---|
| 0 | 0 | 0 | 1 | 3 | 2 | 0 | 1 | 3 | 2 | 0 | 1 | 3 | 2 | 0 | 1 | 3 | 2 | 0 | 1 | 3 | 2 | 0 | 1 | 3 | 2 |
| 0 | 1 | 1 | 0 | 2 | 3 | 2 | 3 | 1 | 0 | 1 | 0 | 2 | 3 | 2 | 3 | 1 | 0 | 3 | 2 | 0 | 1 | 3 | 2 | 0 | 1 |
| 1 | 0 | 2 | 3 | 1 | 0 | 1 | 0 | 2 | 3 | 3 | 2 | 0 | 1 | 3 | 2 | 0 | 1 | 2 | 3 | 1 | 0 | 1 | 0 | 2 | 3 |
| 1 | 1 | 3 | 2 | 0 | 1 | 3 | 2 | 0 | 1 | 2 | 3 | 1 | 0 | 1 | 0 | 2 | 3 | 1 | 0 | 2 | 3 | 2 | 3 | 1 | 0 |

↑  ↑           ↑                    ↑
b1' b2'        b3'                  b0'

Figure 4:
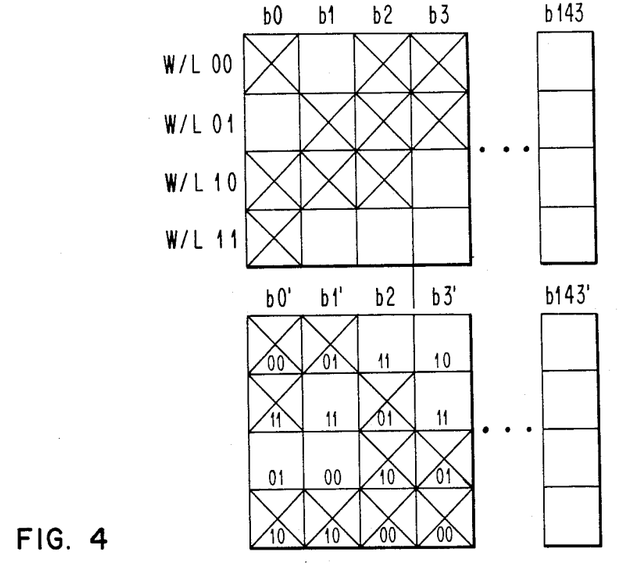
FIG. 4 is a schematic diagram illustrating the use of the permutation logic of FIG. 3 to simultaneously disperse and deallocate faults in a memory.

The stars above the columns of permutation bits in Table 3 each identify a set of permutation bits K4 to K0 used to obtain a bit sequence for bit B0 shown in FIG. 2 and the stars between a column of permutation bits and a sequence of address bits produced by those permutation bits each identify a set of permutation bits used to obtain a bit sequence for bit B1 shown in FIG. 2. Besides giving great freedom in dispersing faults throughout the usable address space, permutation logic of the present invention can be used to simultaneously move certain faults to a deallocated portion of memory while simultaneously dispersing other faults throughout the usable portion of the memory. This is illustrated by FIG. 4. One fault in each bit position is moved to logical word W/L 11 and word W/L 11 is deallocated or not used. The remaining faults are placed in the other logical words of the memory so that there are not more than two bits in error in any of the other logical words of the memory. This permits dection and correction of the data placed in those words by a double error correction-triple error dection (DEC/TED) code.

Figure 5:
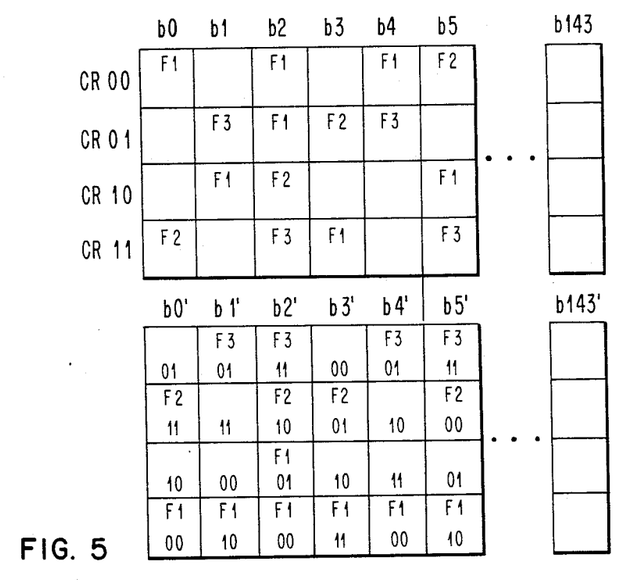
FIG. 5 is a schematic diagram illustrating the use of the permutation logic of FIG. 3 to simultaneously disperse and deallocate faults in a memory that have been categorized by type of error.

Up until now, we have assumed that the Xs in the figure represented a single bit fault. However, as shown in the above mentioned copending Bossen et al. U.S. Patent application, faults can be categorized into types and a memory arranged in chip rows CR so that a number of semiconductor chips supply bits to each bit position bi of a memory and each chip contains bits for the same bit position of a number of memory words. In FIG. 5, each block represents a number of chips in the memory. An F1 in any block indicates that the whole chip is considered not to be usable. An F2 in a block indicates that a column of bits in the chip are faulted and F3 indicates that a row of bits are bad. As chip faults F1, where possible, are placed in the chip row CR 11 in the memory and row CR 11 is not used. The remaining faults are grouped by type and placed in the other logical address spaces. The one chip failure F1 that could not be placed in the bottom most row is placed in row CR 10 by itself, while the chips with bit line failures F2 and word line failures F3 are each grouped together in a different row CR. It is assumed that the bit and word line failures are not aligned so that all the words in the three upper rows of memory can be corrected by a single error correction/double error detection SEC/DED code.

Figure 6:
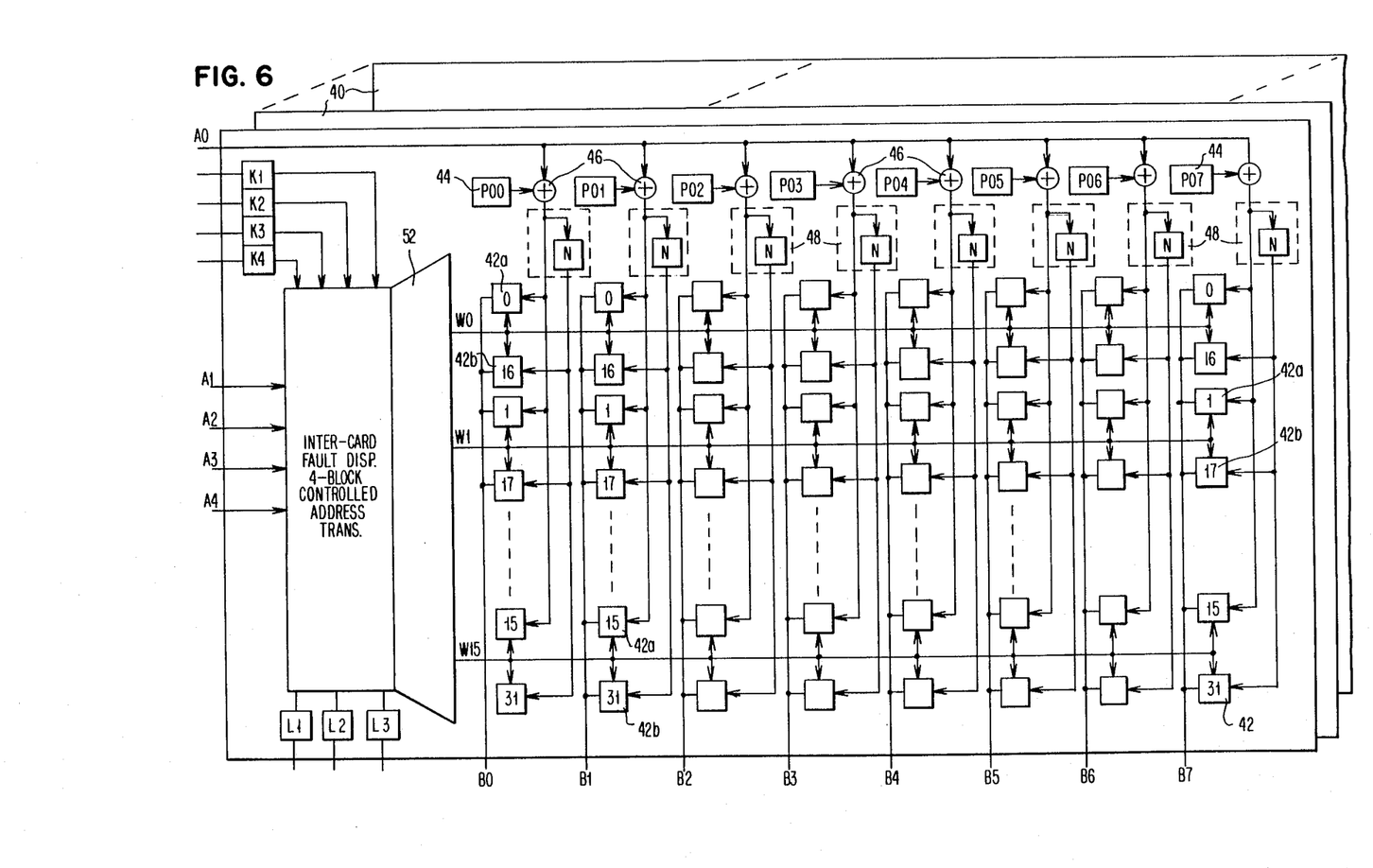
FIG. 6 is a block diagram of a memory employing permutation logic in accordance with the present invention.

In FIG. 6 a 144 bit memory word has each 8 bit bytes on a different one of 16 memory cards 40. Each of the cards 40 contains 256, 64K bit chips 42 (where k=1024) arranged in a matrix of 8 columns of 32 chips each. Logically, the chip matrix on each card consists of 2 partitions of 16×8 chips. A logical word N of 144 bits receives 8 bits contribution from the first partition set of chips 42a from each of the 16 cards, while the next logical word N+1 receives the second partition set of chips 42b from the same 16 cards. The chips within the cards are addressed by five address bits A0 to A4. The first address bit A0 is a chip select bit that selects the first or second partition of the chips 42. The remaining address bits A1 to A4 select one of 16 rows W0 to W15 of the selection partition. Other address bits select one of the 64K bit positions on each of the chips. Such X Y coordinate accessing schemes are well known in the prior art and will not be discussed here.

The fault disperson is accomplished in this memory using two different sets of translation control bits. The first set of 8 translation bits P00 to P07 is used by translation logic for the primary purpose of dispersing aligned faults in different chips in the same row W0 to W15 of a single card. This logic is referred as intra-card fault dispersion logic and consists of a 1 bit latch 44 and a 2 input-EXOR gate 46 and a 1 bit decode circuit 48 in each chip column B0 to B7. In case of a fault alignment on the card, the chips 42a from the first set of 16 chips in a column are swapped with chips 42b from the second set of 16 chips of the same column. Since each of the 8 chip columns receives a separate permutation bit, they can be swapped individually. Therefore, on a per column basis the address space can be mapped in two ways. If a card happens to contain three aligned faults, the described 1 bit address translation scheme cannot misalign all faults to produce words with only one bit errors. However, a word with a three bit error could be divided into one word with a two bit error and another word with a one bit error that can both be corrected by a double error detecting triple error correcting (DED/TED) code.

An additional permutation translation function is performed by permutator 50 controlled by the second set of seven permutation bits to provide $2^7$ way translations of the decode bits A1 to A4. When there is a translation by permutator 50, the logical address of the chips on the card change in rows W0 to W15 of 16 chips. Therefore, if the card contains two fault alignments in any of the partition set in a chip row, then this translation function with 7 translation control bits is unable to misalign them. However, it functions to remove fault alignments between the cards for this reason it is referred to as inter-card or row fault dispersion logic.

Figure 7:
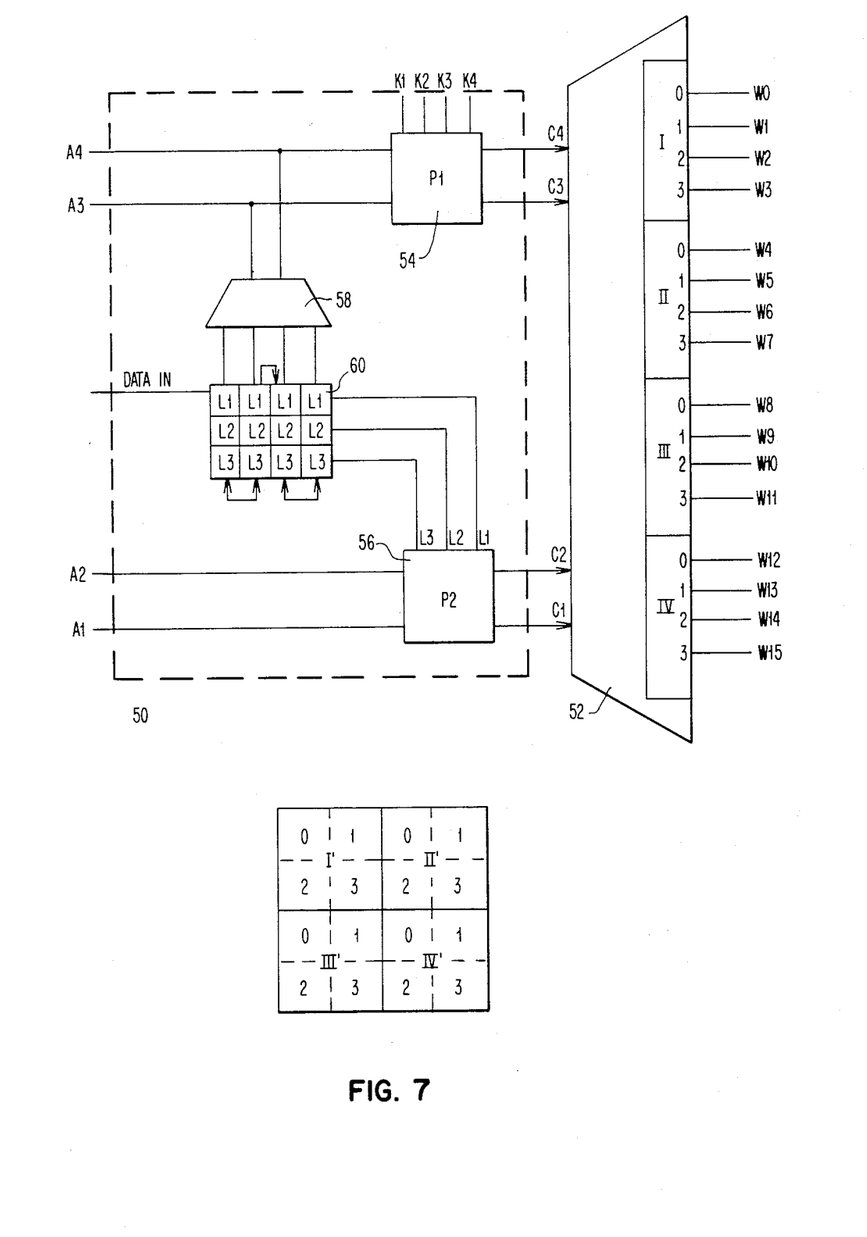
FIG. 7 is a block diagram of permutation logic used in the memory of FIG. 3.

The permutator 50 of FIG. 6 is shown in more detail in FIG. 7. It can be seen that bits A1 through A4 for selecting one of the word lines W0 to W15 are fed through two permutation boxes 54 and 56, one controlled by four permutation bits K1, K2, K3, K4, and the other controlled by three permutation bits L1, L2, L3 where the second set of permutation bits L1, L2 and L3 is one of four such sets selected by decoding the two address bits A3 and A4. The decode bits A3 and A4 are fed into decoder 58 which selects the contents of a different set of 3 permutation bits from a shift register 60 to be fed into the permutation box 56. The shift register contains four sets of permutation bits L1, L2 and L3. Each different combination of bits A3 and A4 provides a gate signal to the output gates of a different set of three latches of the shift register. This results in dividing the 16 lines of the decoder 52 into four quadrants I to IV of four lines each. The selection of the quadrants is controlled by the address bits A3 and A4, while the particular line within the quadrants is selected by the address bits A1 and A2.

Permutator 54 is essentially the permutator of FIG. 3 with K5=0. In the table below K4=1 to illustrate the effects of the permutation vectors on the inputs A4 and A3 to decoder 52 in that condition. The Roman numerals under each set of decoder inputs show the quadrant selected by the inputs.

| A4A3F | K3K2K1 0 0 0 | K3K2K1 0 0 1 | K3K2K1 0 1 0 | K3K2K1 0 1 1 | K3K2K1 1 0 0 | K3K2K1 1 0 1 | K3K2K1 1 1 0 | K3K2K1 1 1 1 |
|---|---|---|---|---|---|---|---|---|
| 0 0 0 | 0 0 (I) | 0 1 (I) | 1 1 (II) | 1 0 (IV) | 0 0 (III) | 0 1 (I) | 1 1 (II) | 1 0 (IV) (III) |
| 0 1 1 | 0 1 (II) | 0 0 (II) | 1 0 (I) | 1 1 (III) | 1 0 (IV) | 1 1 (III) | 0 1 (IV) | 0 0 (II) (I) |
| 1 0 1 | 1 1 (III) | 1 0 (IV) | 0 0 (III) | 0 1 (I) | 1 1 (II) | 1 0 (IV) | 0 0 (III) | 0 1 (I) (II) |
| 1 1 0 | 1 0 (IV) | 1 1 (III) | 0 1 (IV) | 0 0 (II) | 0 1 (I) | 0 0 (I) | 1 0 (I) | 1 1 (III) (IV) |

Figure 8:
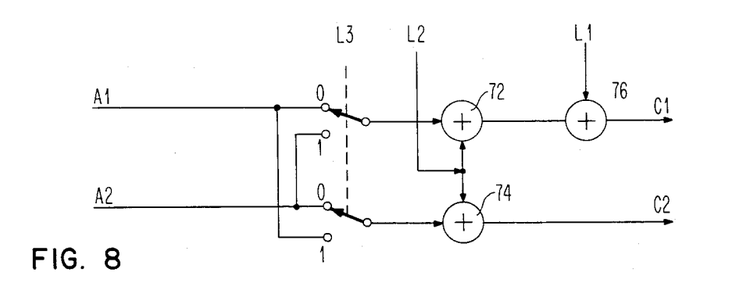
FIG. 8 is a circuit diagram of a portion of the permutation logic used in the block diagram of FIG. 7.

As shown in FIG. 8, permutator 56 is essentially a simplified version of the permutation of FIG. 2 with both K5=0 and K4=0. In the permutator 56, permutation bit L3 permits reversal of the input connections to decode bits A1 and A2. Permutation bit L2 is an input to both Exclusive OR circuits 72 and 74 and permutation bit L1 is an input to Exclusive OR circuit 76. The effect of the various permutation bits have on the decoder inputs L1 and L2 is shown in the following table. The decimal numbers show the bit line selected within each quadrant by the decoder inputs just above them. It must be remembered that decoder 58 effects which set of stored permutation bits is applied to permutator 56.

| A2A1 | L3L2L1 000 | L3L2L1 001 | L3L2L1 010 | L3L2L1 011 | L3L2L1 100 | L3L2L1 101 | L3L2L1 110 | L3L2L1 111 |
|---|---|---|---|---|---|---|---|---|
| 0 0 | 0 0 (0) | 0 1 (0) | 0 1 (1) | 1 1 (3) | 1 0 (2) | 0 0 (0) | 0 1 (1) | 1 1 (3) | 1 0 (2) |
| 0 1 | 0 1 (1) | 0 1 (1) | 0 0 (0) | 1 0 (2) | 1 1 (3) | 1 0 (2) | 1 1 (3) | 0 1 (1) | 0 0 (0) |
| 1 0 | 1 0 (2) | 1 0 (2) | 1 1 (3) | 0 1 (1) | 0 0 (0) | 0 1 (1) | 0 0 (0) | 1 0 (2) | 1 1 (3) |
| 1 1 | 1 1 (3) | 1 1 (3) | 1 0 (2) | 0 0 (0) | 0 1 (1) | 1 1 (3) | 1 0 (2) | 0 0 (0) | 0 1 (1) |

Figure 9:
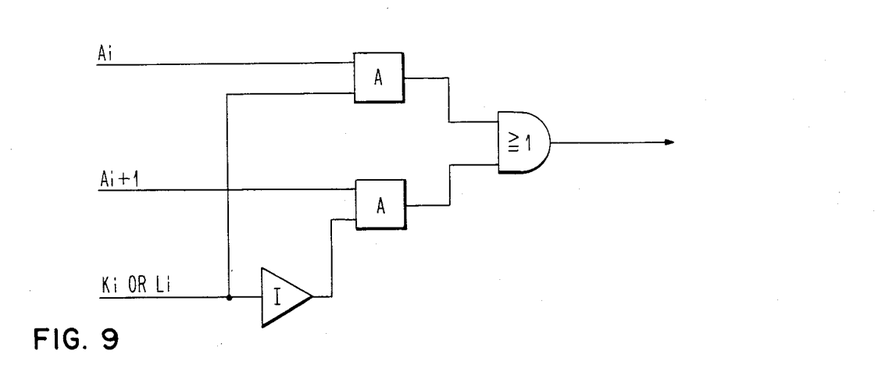
FIG. 9 is a logic diagram for logic performing elements represented as switches in FIGS. 3 and 8.

In FIGS. 2 and 8 certain of the logic is illustrated by single pole, single through switches. Each of these switches shown in FIGS. 2 and 8 is actually a logic circuit as shown in FIG. 9. It receives two of the address bits Ai and Ai+1 and one of the permutation bits Ki or Li to perform the desired permutation.

Above I have described one embodiment of my invention. Therefore, it should be understood that many modifications and changes can be made in the illustrated embodiment without departing from the spirit and scope of the invention as represented in the attached claims.

I claim:

1. In a memory system where N address bits of a logical address used to access the memory system are fed to permutation means to be converted to N actual address bits that are supplied to the inputs of an address decoder means that generates an output in response to the actual address bits to select a memory element from a set of memory elements so that the memory element accessed with a given logical address can be changed by changing permutation bits supplied to the permutation means, a modified permutation means and address decoder means combination comprising:
   address decoder means for decoding actual N address bits into $2^N$ outputs,
   permutation bit means for supplying greater than N permutation bits; and
   extended permutation means responsive to said N logical address bits and said greater than N permutation bits for providing any one of greater than $2^N$ possible permutations of said N logical address bits to said decoder means as N actual address bits.

2. The memory system of claim 1 wherein said extended permutation means includes means responsive to certain of the N logical address bits for selecting permutation bits for permutation of other of the N logical address bits.

3. The memory of claim 1 wherein said extended permutation means has a different input connection to each of said N logical address bits, a different output connection to each of N inputs of the decoder and includes means for switching said connection.

4. In a memory system where address bits of a logical address used to access a logical data word in the memory system are fed to permutation means to be converted to actual address bits that are supplied to the input of a decoder means that generates an output in response to the actual address bits to select a data storage element from a set of data storage elements so that the data storage element accessed using a given logical address can be changed by changing permutation bits supplied to the permutation means, a method of addressing data storage elements comprising:
   dedicating storage elements at an actual address to be used as spares by not using that actual address as a logical address to access a logical data word,
   using the permuting means to convert the address bits of the logical address of a faulty storage element to the actual address bits of a dedicated storage element, and
   concurrently therewith converting address bits of a logical address of another faulty data storage element with the permutation means to the actual address bits of a data storage element that has not been so dedicated.

5. In a memory system where address bits of a logical address used to access the memory system are fed to permutation means to be converted to actual address bits that are supplied to the input of a decoder means that generates an output in response to the actual address bits to select a data storage element from an array of data storage elements so that the data storage element accessed with a given logical address can be changed by changing permutation bits supplied to the permutation means, a new permutation means and decoder means combination:
   multiple decoder means for decoding N actual address bits into an output made up of multiple storage element select signals each select signal on a separate output line in a different set of output lines for accessing one of the data storage elements,
   permutation means for receiving the N logical address bits of said given logical address and for providing permutations of said N logical address bits which will effect the select signals independently of one another to change the storage element accessed by said given logical address.

6. In a memory system where address bits of a logical address used to access the memory system are fed to permutation means to produce actual address bits that are supplied to the input of an address decoder means that generates an output in response to the actual address bits to select a memory element from an array of memory elements so that the memory element selected by a given logical address can be changed by changing permutation bits supplied to the permutation means, a modified permutation means and decoder combination comprising:
   address decoder means for decoding a set of N actual address bits into a memory element select signal which is placed on one of $2^N$ output lines of the decoder to select a memory element, said output lines and the memory elements being arranged in groups in which selection of a memory element within the group is determined by lower order actual address bits from said set while higher order actual address bits from said set determine group membership,
   first permutation means for permuting logical address bits to produce the higher order actual address bits,
   second permutation means for permuting logical address bits to produce lower order actual address bits independently of the higher order actual address bits whereby the memory element selected by a given logical address can be changed from one memory element to another within the same group without affecting selection of memory element in other groups.

* * * * *